United States Patent
Tomita et al.

(10) Patent No.: US 8,238,504 B2
(45) Date of Patent: Aug. 7, 2012

(54) CLOCK GENERATION CIRCUIT AND SYSTEM

(75) Inventors: Yasumoto Tomita, Kawasaki (JP); Masaya Kibune, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 421 days.

(21) Appl. No.: 12/633,558

(22) Filed: Dec. 8, 2009

(65) Prior Publication Data
US 2010/0202578 A1    Aug. 12, 2010

(30) Foreign Application Priority Data
Feb. 6, 2009  (JP) .................................. 2009-26560

(51) Int. Cl.
*H04L 7/00*   (2006.01)
*H04L 25/00*   (2006.01)
*H04L 25/40*   (2006.01)
(52) U.S. Cl. ......... 375/371; 375/327; 375/373; 375/376
(58) Field of Classification Search .................. 375/327, 375/371, 373, 376; 455/260; 327/156
See application file for complete search history.

(56) References Cited

U.S. PATENT DOCUMENTS

| 7,489,743 B2 | 2/2009 | Koh et al. |
| 2001/0045868 A1* | 11/2001 | Takeyabu et al. ............. 331/2 |
| 2002/0172304 A1* | 11/2002 | Saze et al. ................ 375/340 |
| 2004/0104753 A1* | 6/2004 | Haraguchi et al. .......... 327/291 |
| 2006/0013349 A1 | 1/2006 | Koh et al. |

FOREIGN PATENT DOCUMENTS

| JP | 2006-033824 A | 2/2006 |
| JP | 2006-101268 A | 4/2006 |
| JP | 2008-011173 A | 1/2008 |

* cited by examiner

*Primary Examiner* — Ted Wang
(74) *Attorney, Agent, or Firm* — Arent Fox LLP

(57) ABSTRACT

A clock generation circuit includes: a first determination circuit that detects an input signal at a first phase position based on first frequency signal; a second determination circuit that detects the input signal at a second phase position based on second frequency signal; a phase detector that compares output of the first determination circuit and output of the second determination circuit; a first summing circuit which sums comparison result and first control signal; a second summing circuit which sums comparison result and second control signal; a first voltage controlled oscillation circuit which receives output of the first summing circuit and outputs the first frequency signal; a second voltage controlled oscillation circuit which received output of the second summing circuit and outputs the second frequency signal; and a phase adjustment circuit which generates first control signal and second control signal based on first frequency signal and second frequency signal.

15 Claims, 17 Drawing Sheets

CLOCK GENERATION CIRCUIT AND SYSTEM

CROSS-REFERENCE TO RELATED APPLICATIONS

This application claims the benefit of priority from Japanese Patent Application No. 2009-26560 filed on Feb. 6, 2009, the entire contents of which are incorporated herein by reference.

BACKGROUND

1. Field

Embodiments discussed herein relate to a receiving circuit.

2. Description of Related Art

In a high-speed signal transmission, a clock signal is recovered from the received data at receiver side and the recovered clock signal is used to perform the "0" or "1" determination of data (Clock and Data Recovery, CDR). The phase of the recovered clock signal is adjusted by a feedback circuit such that the recovered clock signal and the received data are in a certain phase relationship. The clock signal and data recovery circuit generates an appropriate clock signal based on the received data as well as detects the received data based on the generated clock.

Related arts are disclosed in Japanese Laid-open Patent Publication No. 2008-11173, Japanese Laid-open Patent Publication No. 2006-33824, and Japanese Laid-open Patent Publication No. 2006-101268, etc.

SUMMARY

According to one aspect of the embodiments, a clock generation circuit is provided which includes: a first determination circuit which receives an input signal and detects the input signal at a first phase position based on a first frequency signal; a second determination circuit which receives the input signal and detects the input signal at a second phase position based on a second frequency signal; a phase detector which compares an output of the first determination circuit and an output of the second determination circuit and outputs a comparison result; a first summing circuit which sums the comparison result and a first control signal; a second summing circuit which sums the comparison result and a second control signal; a first voltage controlled oscillation circuit which receives the output of the first summing circuit and outputs the first frequency signal; a second voltage controlled oscillation circuit which received the output of the second summing circuit and outputs the second frequency signal; and a phase adjustment circuit which generates the first control signal and the second control signal based on the first frequency signal and the second frequency signal.

Additional advantages and novel features of the invention will be set forth in part in the description that follows, and in part will become more apparent to those skilled in the art upon examination of the following or upon learning by practice of the invention.

DESCRIPTION OF EMBODIMENTS

As a clock and data recovery scheme, a bang-bang control clock-and-data recovery scheme may be used. In a bang-bang control clock-and-data recovery scheme, an internal clock of a receiver is used to sample the received signal at two sampling points, for example, a data center assumed position and a data boundary assumed position, per one unit time, for example, a unit interval of the received signal. A feedback control is performed based on the sampled data such that the sampling clock is positioned substantially at the center of the received data. The frequency of the internal clock may be twice the frequency of the received signal. A multi-phase clock may be used without increasing the frequency of the internal clock.

In a bang-bang control clock-and-data recovery circuit which adopts a multi-phase clock scheme, a voltage controlled oscillator (VCO) generates a clock signal with four phases. Based on the clock signal with four phases, a phase interpolator (PI) generates a multi-phase clock signal for sampling the position assumed to be substantially the center of data, and a multi-phase clock signal for sampling the position assumed to be substantially the boundary of data. Based on the sampled data, determination is made as to whether the clock phase is early or late with respect to the data phase. Based on the determination result, a control voltage to be supplied to the voltage controlled oscillator may be adjusted.

In a bang-bang control clock-and-data recovery scheme, a phase interpolation circuit that operates at a high frequency may become necessary.

Figure 1:
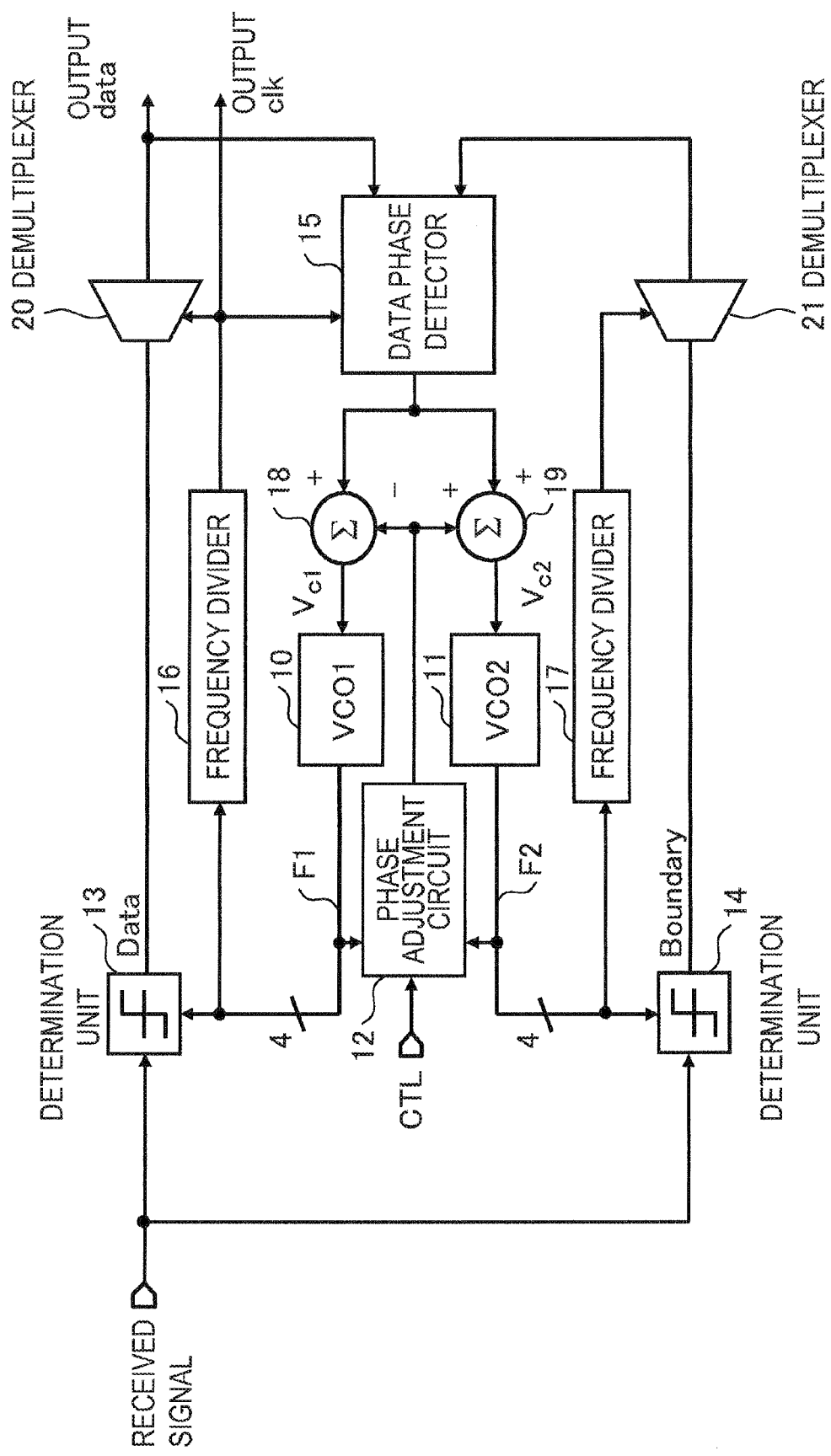
FIG. 1 illustrates a first embodiment.

FIG. 1 illustrates a first embodiment. A clock and data recovery circuit illustrated in FIG. 1 generates a clock signal based on the received data as well as detects the received data based on the generated clock signal. The clock and data recovery circuit includes a voltage controlled oscillator 10 (VCO1), a voltage controlled oscillator 11 (VCO2), a phase adjustment circuit 12, a data determination unit 13, a boundary determination unit 14, a data phase detector 15, a frequency divider 16, a frequency divider 17, a summing circuit 18, a summing circuit 19, a demultiplexer 20, and a demultiplexer 21.

The voltage controlled oscillator 10 outputs a first frequency signal F1 in accordance with a first input voltage Vc1. The first frequency signal F1 may be, for example, a clock signal with four phases. The voltage controlled oscillator 11 outputs a second frequency signal F2 in accordance with a second input voltage Vc2. The second frequency signal F2 may be, for example, a clock signal with four phases. The phase adjustment circuit 12 receives a control signal CTL and controls the first input voltage Vc1 and the second input voltage Vc2 such that the phase difference between the first frequency signal F1 and the second frequency signal F2 has a value in accordance with the control signal CTL. For example, sampling may be conducted at an optimum data position of the received signal, for example, a data center position based on the phase of the first frequency signal F1, and also sampling may be conducted at a data boundary position of the received signal based on the phase of the second frequency signal F2. The optimum data position may be, for example, a position at which the amplitude of data signal reaches a maximum point. Moreover, an optimum data position may be the center of a data eye, for example, an intermediate position between two adjacent data boundaries.

The data determination unit 13 detects and outputs a received signal in synchronization with the frequency signal F1. For example, a received signal is sampled at an edge of the first frequency signal F1, the sampled data value is subjected to "0" or "1" determination, and the determination result is output. The data determination unit 13 receives an input signal, and detects and outputs the input signal at a first phase position based on the first frequency signal F1. The boundary determination unit 14 detects and outputs a received signal in synchronization with the second frequency signal F2. For example, the received signal is sampled at an edge of the second frequency signal F2, the sampled data value is subjected to "0" or "1" determination, and the determination result is output. The boundary determination unit 14 receives an input signal, and detects and outputs the input signal at a second phase position based on the second frequency signal F2. The output of the data determination unit 13 may be a data determination value, for example, the determination value of the received signal at a position at which the received data is supposed to be present. The output of the boundary determination unit 14 may be a boundary determination value, for example, the determination value of the received signal at a position at which a boundary between adjacent received data is supposed to be present.

The data phase detector 15 detects the phase of received signal based on the output of the data determination unit 13 and the output of the boundary determination unit 14, and controls the first input voltage Vc1 and the second input voltage Vc2 according to the result of the phase detection. For example, whether a preceding data determination value and a succeeding boundary determination value are equal to or different from each other is detected. Additionally, whether a preceding boundary determination value and a succeeding data determination value are equal to or different from each other is also detected. As the frequency at which a preceding data determination value equals to a succeeding boundary determination value is high, the frequency at which a preceding boundary determination value differs from a succeeding data determination value increases and the phase of the clock may be too early with respect to the phase of the received signal. As the frequency at which a preceding data determination value differs from a succeeding boundary determination value is high, the frequency at which a preceding boundary determination value equals to a succeeding data determination value increases and the phase of the clock may be too late with respect to the phase of the received signal. As a result of the first input voltage Vc1 and the second input voltage Vc2 being controlled according to the detection result, the phases of the first frequency signal F1 and the second frequency signal F2 are adjusted with respect to the phase of the received signal. The data phase detector 15 compares the output of the data determination unit 13 with the output of the boundary determination unit 14 and outputs the comparison result.

At the summing circuit 18, the output voltage of the data phase detector 15, which is the comparison result, and the voltage of the first control signal of negative polarity side, which is the output of the phase adjustment circuit 12, are summed to generate a first input voltage Vc1. At the summing circuit 19, the output voltage of the data phase detector 15, which is the comparison result, and the voltage of the second control signal of the positive polarity side, which is the output of the phase adjustment circuit 12, are summed to generate a second input voltage Vc2. The first control signal and the second control signal may be signals having the same magnitude and different polarities, for example, signs. As the output voltage of the data phase detector 15 increases, the frequencies of the first frequency signal F1 and the second frequency signal F2 increase. As the output voltage of the data phase detector 15 decreases, the frequencies of the first frequency signal F1 and the second frequency signal F2 decrease. As the output voltage of the phase adjustment circuit 12 increases, the frequency difference between the first frequency signal F1 and the second frequency signal F2 increases. As the output voltage of the phase adjustment circuit 12 decreases, the frequency difference between the first frequency signal F1 and the second frequency signal F2 decreases. As the frequency increases, the phase advances, and as the frequency decreases, the phase retards. As the frequency difference increases, the change of phase difference increases, and as the frequency difference decreases, the change of the phase difference decreases. As a result of such frequency adjustment, a phase adjustment of the frequency signal is performed.

The demultiplexers 20 and 21 demultiplex the data determination value and the boundary determination value to reduce the frequency, and supplies these values as parallel data to the data phase detector 15. The clock and data recovery circuit outputs the parallel data, which is the output of the demultiplexer 20, as the data output. The clock and data recovery circuit of FIG. 1 outputs, as the clock output, a frequency-divided clock signal resulting from the first frequency signal F1, which is output by the voltage controlled oscillator 10 in accordance with the frequency of the data determination value after demultiplexing, being divided by the frequency divider 16. The frequency-divided clock signal output by the frequency divider 16 is used at the demultiplexer 20 and the data phase detector 15. The frequency-divided clock signal resulting from the second frequency signal F2, which is output by the voltage controlled oscillator 11, being frequency divided at the frequency divider 17 is used at the demultiplexer 21.

At the clock and data recovery circuit, the data determination unit 13 and the boundary determination unit 14 use two frequency signals F1 and F2, which are generated by the voltage controlled oscillators 10 and 11, respectively as the frequency signal for the sampling clock. The phase adjustment circuit 12 adjusts the phase difference according to the control signal CTL such that the phase difference between the frequency signals F1 and F2 becomes a given value, for example, 90 degrees. The data determination unit 13 and the boundary determination unit 14 may not include a phase interpolator, for example, a mixer circuit, for generating a signal used as the sampling clock.

Figure 2:
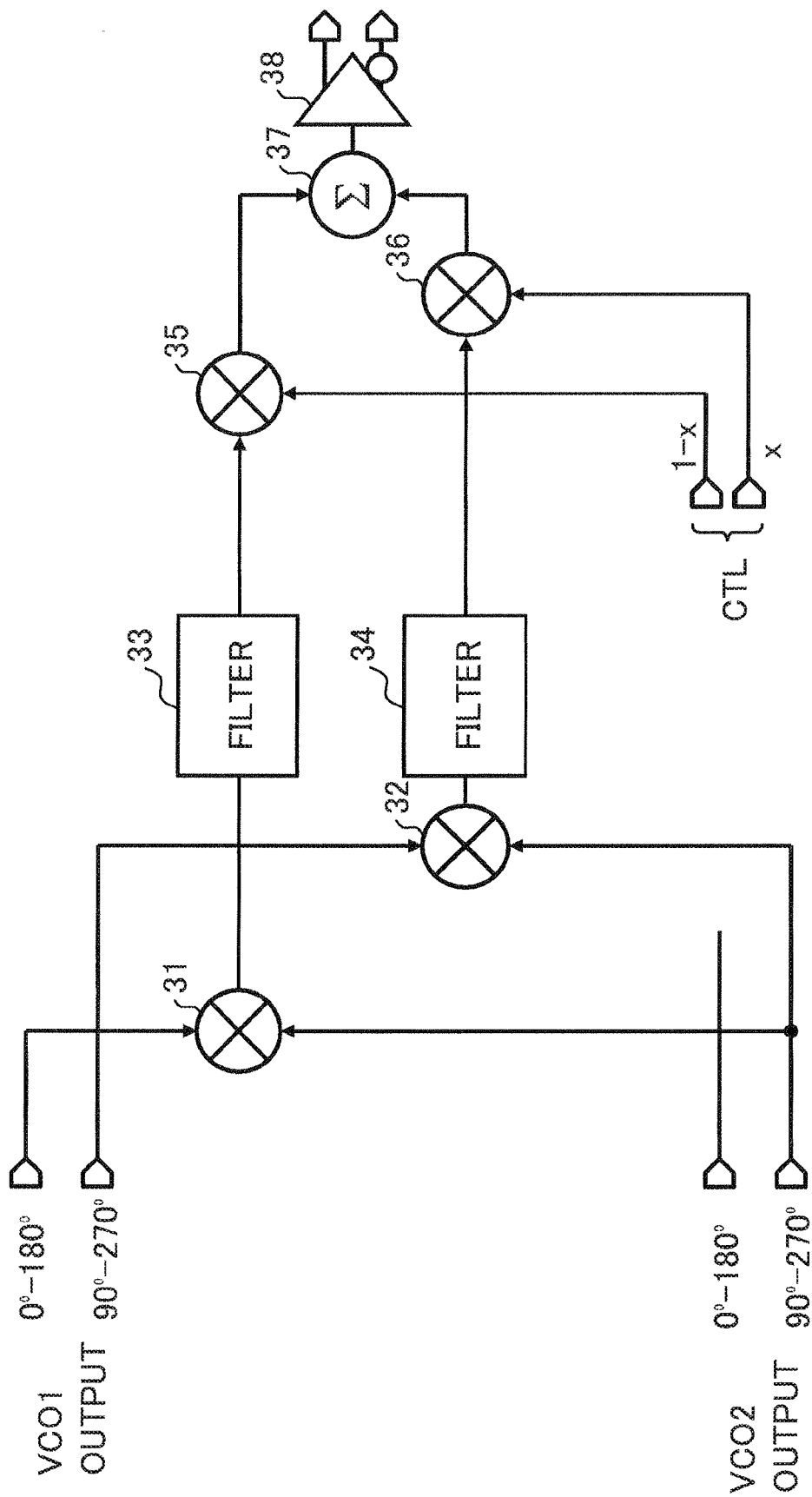
FIG. 2 illustrates an exemplary phase adjustment circuit.

FIG. 2 illustrates an exemplary phase adjustment circuit. The phase adjustment circuit illustrated in FIG. 2 may be the phase adjustment circuit 12 illustrated in FIG. 1. The phase adjustment circuit 12 includes a mixer circuit 31, a mixer circuit 32, a filter 33, a filter 34, a weighting circuit 35, a weighting circuit 36, a summing circuit 37, and an output circuit 38. The clock and data recovery circuit illustrated in FIG. 1 and the phase adjustment circuit 12 illustrated in FIG. 2 may receive a differential input signal and output a differential output signal. The clock and data recovery circuit illustrated in FIG. 1 and the phase adjustment circuit 12 illustrated in FIG. 2 may receive a single-phase signal and output a single-phase signal.

The first frequency signal F1 output by the voltage controlled oscillator (VCO1) 10 may be, for example, a frequency signal with four phases. The frequency signal with four phases may have phases of 0, 90, 180, and 270 degrees respectively, each being shifted by 90 degrees from another. The second frequency signal F2 output by the voltage controlled oscillator (VCO2) 11 may be, for example, a frequency signal with four phases. The frequency signal with four phases may have phases of 0, 90, 180, and 270 degrees respectively, each being shifted by 90 degrees from another. The mixer circuit 31 receives frequency signals of 0 and 180 degrees within the first frequency signal F1 with four phases, and frequency signals of 90 and 270 degrees within the second frequency signal F2 with four phases. Within the first frequency signal F1 with four phases, the frequency signals of 0 and 180 degrees may be in a differential relationship. Within the second frequency signal F2 with four phases, the frequency signals of 90 and 270 degrees may be in a differential relationship. The mixer circuit 31 multiplies input frequency signals with each other and outputs a signal having a frequency twice the input signal frequency and a direct-current voltage signal in accordance with the phase difference between the input frequency signals. The mixer circuit 32 receives frequency signals of 90 and 270 degrees within the first frequency signal F1 with four phases and frequency signals of 90 and 270 degrees within the second frequency signal F2 with four phases. The frequency signals of 90 and 270 degrees within the first frequency signal F1 with four phases may be in a differential relationship with each other. The frequency signals of 90 and 270 degrees within the second frequency signal F2 with four phases may be in a differential relationship with each other. The mixer circuit 32 multiplies input frequency signals with each other and outputs a signal having a frequency twice the input signal frequency and a direct-current voltage signal in accordance with the phase difference between the input frequency signals.

The filter 33 may be a low-pass filter. As a result of the output signal of the mixer circuit 31 being low-pass filtered, double-frequency components of the output signal are removed and a direct-current voltage component in accordance with the phase difference is extracted. The filter 34 may be a low-pass filter. As a result of the output signal of the mixer circuit 32 being low-pass filtered, double-frequency components of the output signal are removed and a direct-current voltage component in accordance with the phase difference is extracted. The weighting circuit 35 may be a multiplier. The multiplier multiplies the direct-current voltage component, which is output by the filter 33 and indicates the phase difference, by 1−x, which is one value of a pair of control signals CTL. The weighting circuit 36 may be a multiplier. The multiplier multiplies the direct-current voltage component, which is output by the filter 34 and indicates the phase difference, by x which is another value of the pair of control signals CTL. For example, x may be not less than 0 and not more than 1. The summing circuit 37 performs the summation of direct-current voltage components after weighting. The output circuit 38 includes an output signal driving circuit, for example, an amplification circuit. The output circuit 38 outputs a differential signal in accordance with the summed result output by the summing circuit 37.

For example, when x is "1", the output circuit 38 may output a voltage in accordance with the phase difference between the frequency signal having a phase of 90 degrees (and a signal of its reverse phase) within the first frequency signal F1 and the frequency signal having a phase of 90 degrees (and a signal of its reverse phase) within the second frequency signal F2. As the phase difference increases, the voltage to be output increases, and as the phase difference decreases, the voltage to be output decreases. As the output voltage of the phase adjustment circuit 12 increases, the frequency difference between the first frequency signal F1 and the second frequency signal F2 increases. As the output voltage of the phase adjustment circuit 12 decreases, the frequency difference between the first frequency signal F1 and the second frequency signal F2 decreases. As the frequency difference increases, the change in the phase difference increases, and as the frequency difference decreases, the change in the phase difference decreases. For example, when x is "1", adjustment is made such that the first frequency signal F1 and the second frequency signal F2 have substantially the same frequency, and the phase difference between the frequency signal having a phase of 90 degrees within the first frequency signal F1 and the frequency signal having a phase of 90 degrees within the second frequency signal F2 becomes zero.

For example, when x is "0", the output circuit 38 may output a voltage in accordance with the phase difference between the frequency signal having a phase of 0 degree (and a signal of its reverse phase) within the first frequency signal F1 and the frequency signal having a phase of 90 degrees (and a signal of its reverse phase) within the second frequency signal F2. As the phase difference increases, the voltage to be output increases, and as the phase difference decreases, the voltage to be output decreases. For example, when x is "0", adjustment is made such that the first frequency signal F1 and the second frequency signal F2 have substantially the same frequency, and the phase difference between the frequency signal having a phase of 0 degree within the first frequency signal F1 and the frequency signal having a phase of 90 degrees within the second frequency signal F2 becomes zero. Adjustment is made such that the phase difference between the frequency signal having a phase of 0 degree within the first frequency signal F1 and the frequency signal having a phase of 0 degree within the second frequency signal F2 becomes 90 degrees.

For example, when x is more than 0 and less than 1, adjustment may be made such that the phase difference is a value between 90 degrees which is the phase difference when x is "0", and 0 degree which is the phase difference when x is "1". For example, when x is "0.5", adjustment may be made such that the first frequency signal F1 and the second frequency signal F2 have substantially the same frequency, and the phase difference between the frequency signal having a phase of 0 degree within the first frequency signal F1 and the frequency signal having a phase of 0 degree within the second frequency signal F2 becomes 45 degrees. As a result of the adjustment of the value of x, a desired phase difference from 0 to 90 degrees may be obtained.

Figure 3:
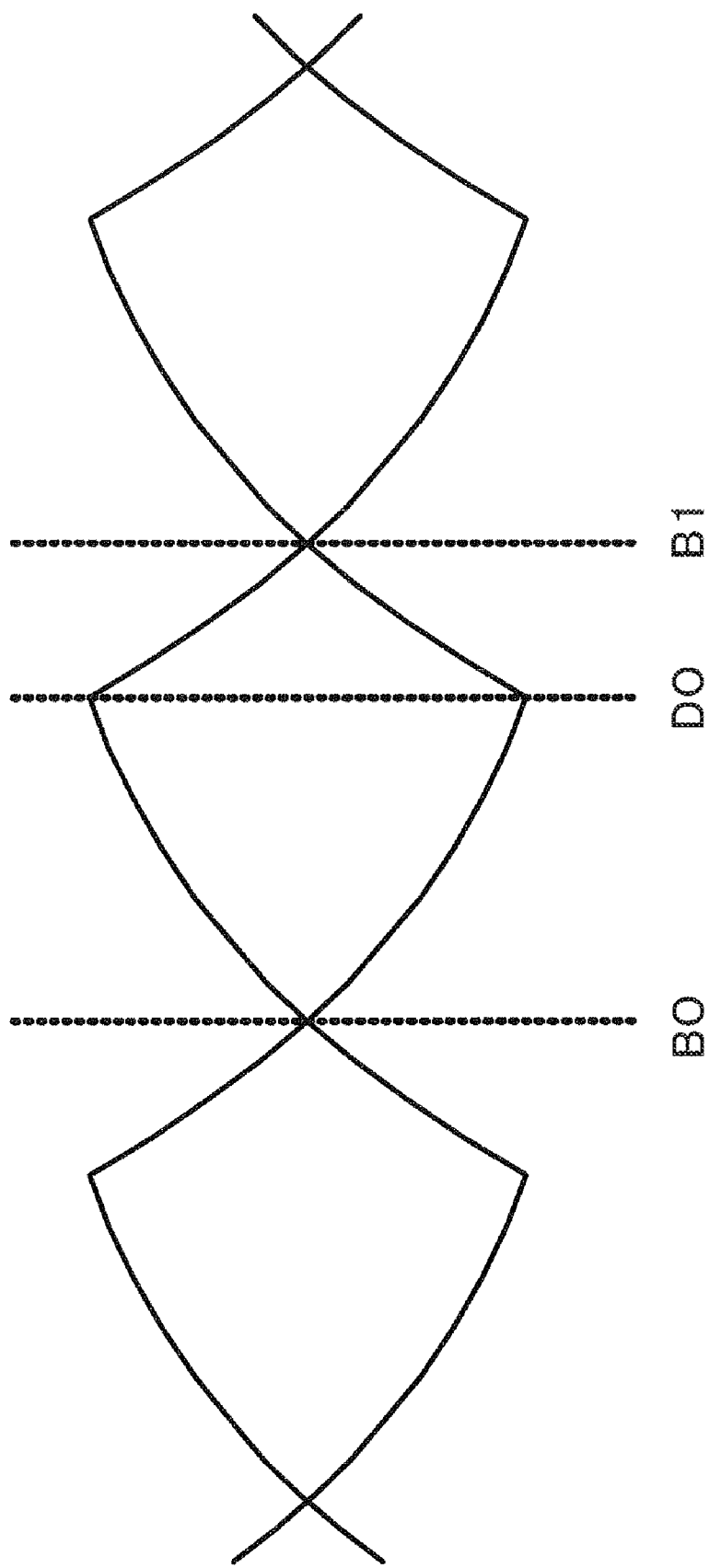
FIG. 3 illustrates an exemplary waveform of a received signal.

FIG. 3 illustrates an exemplary waveform of a received signal. The waveform illustrated in FIG. 3 may be distorted due to bandwidth limiting, etc. The position D0, at which the data signal amplitude becomes maximum, is deviated from the center between the data boundary positions B0 and B1. For that reason, the data signal may be sampled at a point of maximum signal amplitude, which is located not at a central point of data eye, but at a position off the center. The data sampling and detection may be performed with the phase difference between the frequency signal having a phase of 0 degree within the first frequency signal F1 and the frequency signal having a phase of 0 degree within the second frequency signal F2 being set at, for example, 60 degrees. In the clock and data recovery circuit illustrated in FIG. 1, the control signal CTL is adjusted to obtain a desired phase difference.

In the latter stage of the phase adjustment circuit 12, a direct-current signal component dependent on the phase difference of the input signals within the output signal components of the mixer circuits 31 and 32 is used. The direct-current signal component, which does not need to be oscillated at a high speed in a like manner with the input frequency signal, keeps a constant value provided the phase difference is constant. When the phase difference changes, the direct-current signal component slowly changes in accordance with the change. The mixer circuits 31 and 32 generate a direct-current signal component in accordance with the phase difference at a sufficient accuracy.

Figure 4:
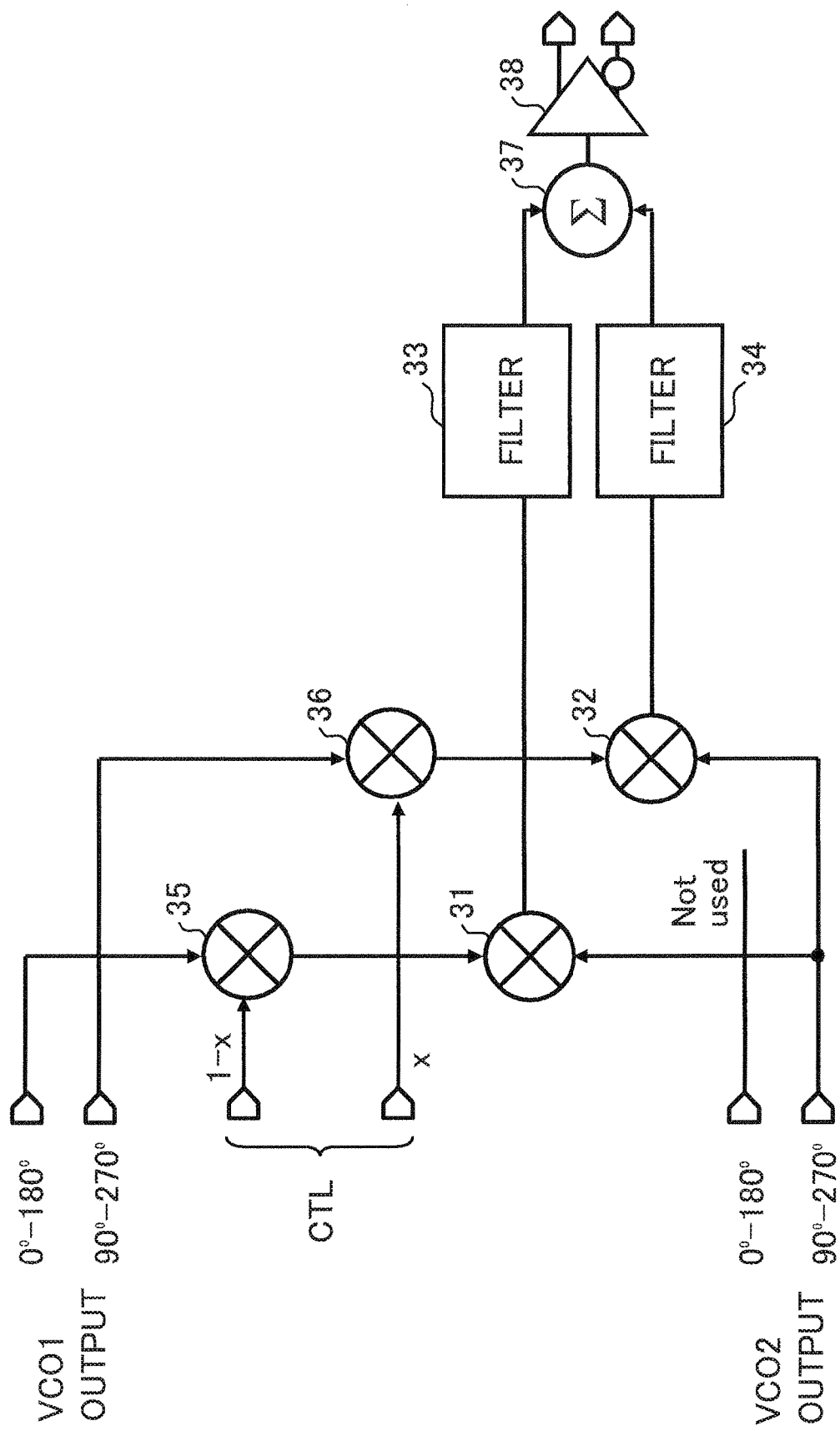
FIG. 4 illustrates an exemplary phase adjustment circuit.

FIG. 4 illustrates an exemplary phase adjustment circuit. The phase adjustment circuit illustrated in FIG. 4 may be the phase adjustment circuit 12 illustrated in FIG. 1. In the phase adjustment circuit illustrated in FIG. 4, like numbers are given to components which have functions substantially the same as or similar to those of the phase adjustment circuit illustrated in FIG. 2. In the phase adjustment circuit 12 illustrated in FIG. 4, weighting circuits 35 and 36 are provided between the output of the voltage controlled oscillator (VCO1) 10 and the inputs of the mixer circuits 31 and 32, respectively. Before mixing by the mixer circuits, the output of the voltage controlled oscillator 10 may be multiplied by a weight in accordance with the control signal CTL (x and x−1). The output of the phase adjustment circuit illustrated in FIG. 4 may be substantially the same as the output of the phase adjustment circuit illustrated in FIG. 2.

Figure 5:
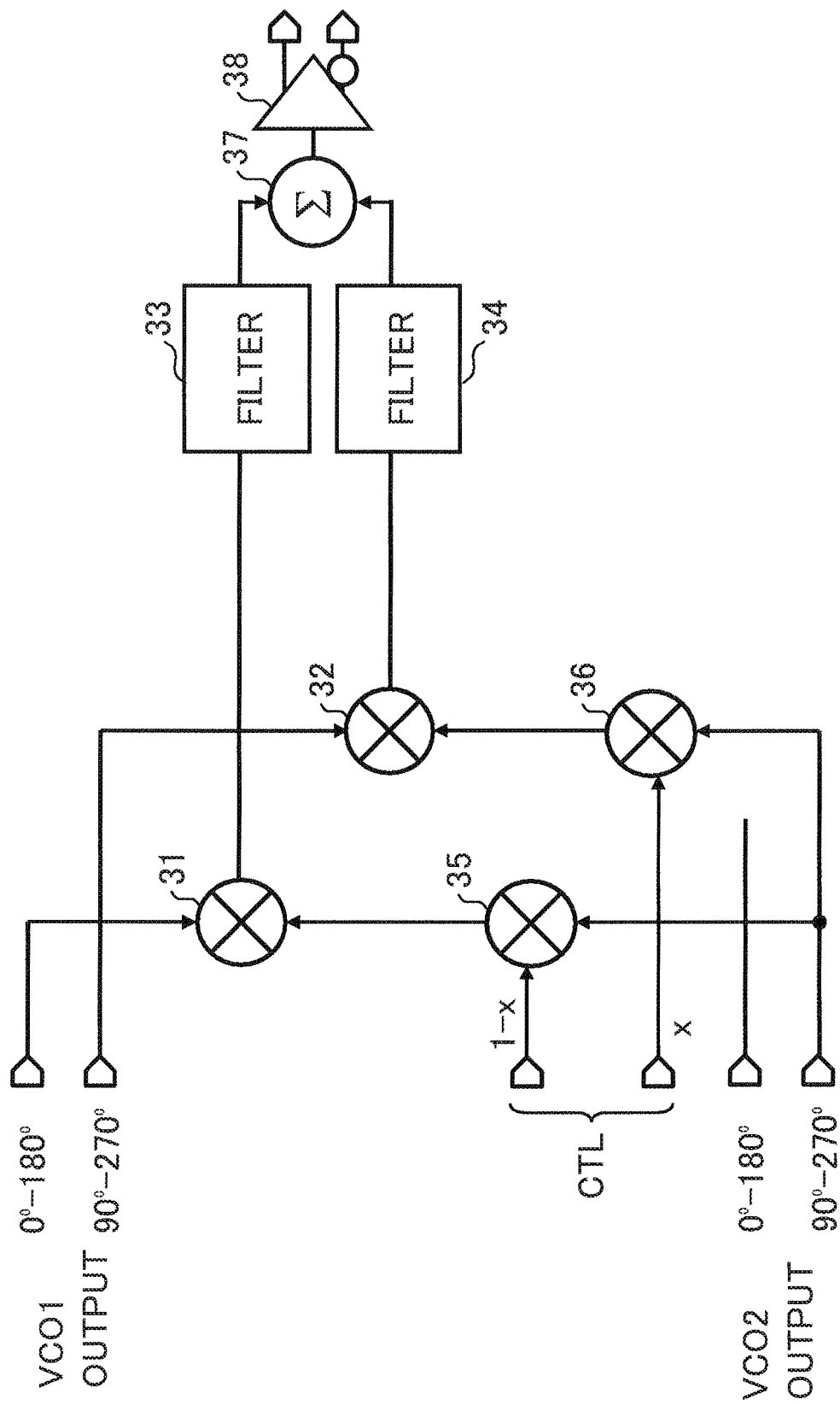
FIG. 5 illustrates an exemplary phase adjustment circuit.

FIG. 5 illustrates an exemplary phase adjustment circuit. The phase adjustment circuit illustrated in FIG. 5 may be the phase adjustment circuit 12 illustrated in FIG. 1. In the phase adjustment circuit illustrated in FIG. 5, like numbers are given to components which have functions substantially the same as or similar to those of the phase adjustment circuit illustrated in FIG. 2. In the phase adjustment circuit 12 illustrated in FIG. 5, weighting circuits 35 and 36 are provided between the output of the voltage controlled oscillator (VCO2) 11 and the inputs of the mixer circuits 31 and 32, respectively. Before mixing by the mixer circuits, the output of the voltage controlled oscillator 11 may be multiplied by a weight in accordance with the control signal CTL (x and x−1). The output of the phase adjustment circuit illustrated in FIG. 5 may be substantially the same as the output of the phase adjustment circuit illustrated in FIG. 2.

Figure 6:
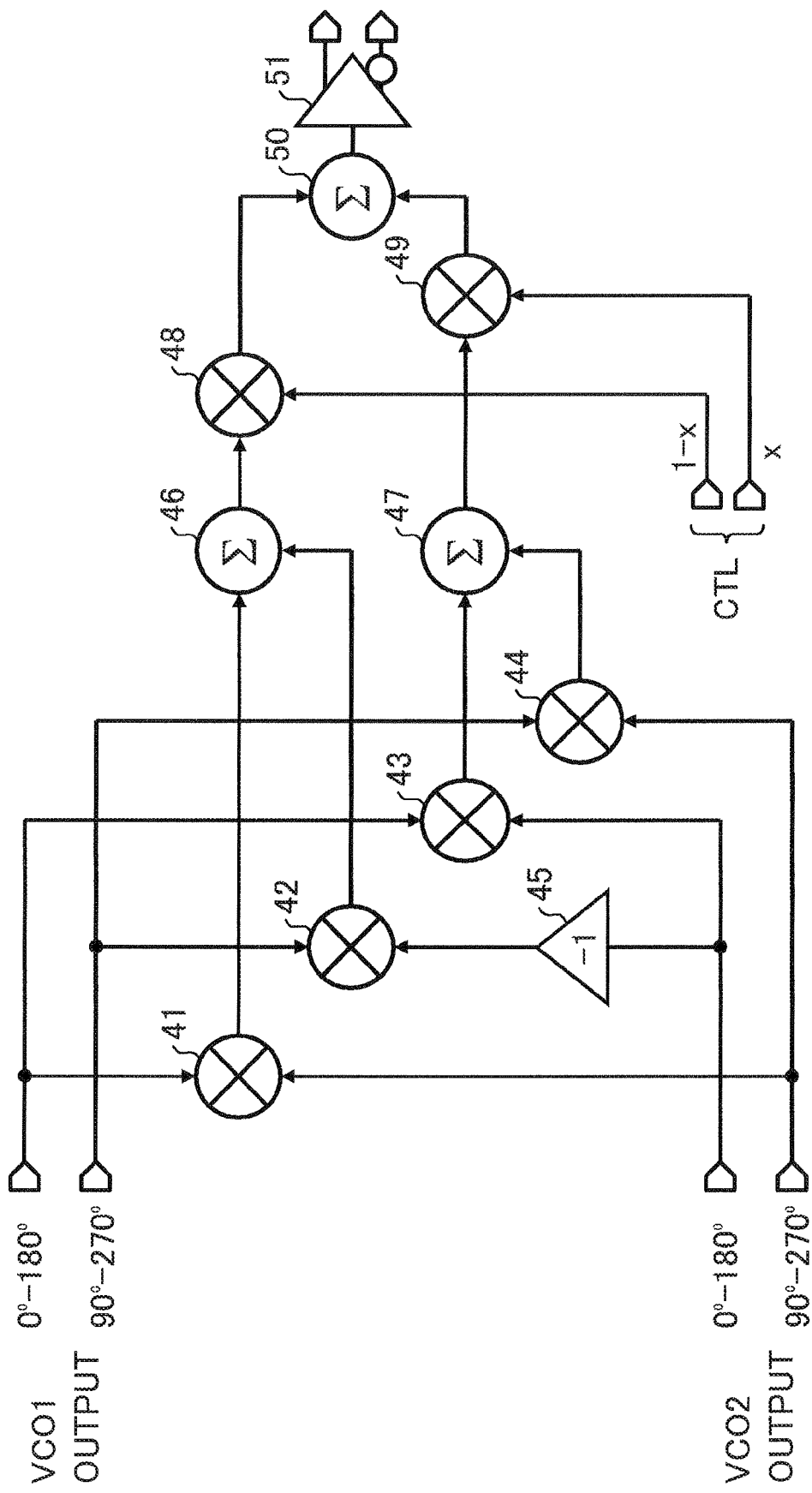
FIG. 6 illustrates an exemplary phase adjustment circuit.

FIG. 6 illustrates an exemplary phase adjustment circuit. The phase adjustment circuit illustrated in FIG. 6 may be the phase adjustment circuit 12 illustrated in FIG. 1. The phase adjustment circuit 12 of FIG. 6 includes mixer circuits 41 to 44, an inverting circuit 45, summing circuits 46 and 47, weighting circuits 48 and 49, a summing circuit 50 and an output circuit 51. The mixer circuit 41 receives frequency signals of 0 and 180 degrees within the first frequency signal F1 with four phases and frequency signals of 90 and 270 degrees within the second frequency signal F2 with four phases. The frequency signals of 0 and 180 degrees within the first frequency signal F1 with four phases may be in a differential relationship with each other. The frequency signals of 90 and 270 degrees within the second frequency signal F2 with four phases may be in a differential relationship with each other. The mixer circuit 41 multiples input frequency signals with each other and outputs a signal having a frequency of twice the input signal frequency, and a direct-current voltage signal in accordance with the phase difference between the input frequency signals. The mixer circuit 42 receives frequency signals of 90 and 270 degrees within the first frequency signal F1 with four phases and the inverted signal of the frequency signal of 0 and 180 degrees within the second frequency signal F2 with four phases. The frequency signals of 90 and 270 degrees within the first frequency signal F1 with four phases may be in a differential relationship with each other. The frequency signals of 0 and 180 degrees within the second frequency signal F2 with four phases may be in a differential relationship with each other. The inverted signal, which is a signal where positive and negative signs are inverted, is generated by the inverting circuit 45. The mixer circuit 42 multiplies the input frequency signals with each other, and outputs a signal having a frequency of twice the input signal frequency, and a direct-current voltage signal in accordance with the phase difference between the input frequency signals.

The mixer circuit 43 receives the frequency signals of 0 and 180 degrees within the first frequency signal F1 with four phases and the frequency signals of 0 and 180 degrees within the second frequency signal F2 with four phases. The mixer circuit 43 multiples input frequency signals with each other and outputs a signal having a frequency of twice the input signal frequency, and a direct-current voltage signal in accordance with the phase difference between the input frequency signals. The mixer circuit 44 receives the frequency signals of 90 and 270 degrees within the first frequency signal F1 with four phases and the frequency signals of 90 and 270 degrees within the second frequency signal F2 with four phases. The mixer circuit 44 multiples input frequency signals with each other and outputs a signal having a frequency of twice the input signal frequency, and a direct-current voltage signal in accordance with the phase difference between the input frequency signals.

The summing circuit 46 sums the output of the mixer circuit 41 and the output of the mixer circuit 42 to cancel double-frequency components, and extracts a direct-current voltage component in accordance with the phase difference. The summing circuit 47 sums the output of the mixer circuit 43 and the output of the mixer circuit 44 to cancel double-frequency components, and extracts a direct-current voltage component in accordance with the phase difference. The weighting circuit 48 multiplies the direct-current voltage component indicating the phase difference output by the summing circuit 46 by 1−x, which is one value of a pair of control signals CTL. The weighting circuit 49 multiplies the direct-current voltage component indicating the phase difference output by the summing circuit 47 by x, which is the other value of the pair of control signals CTL. The value x may be not less than 0 and not more than 1. The summing circuit 50 sums the direct-current voltage components after weighting. The output circuit 51 may include an output signal driving circuit, for example, an amplification circuit. The output circuit 51 outputs a differential signal in accordance with the summed result output by the summing circuit 50.

As a result of x being set to be a value between 0 and 1, the first frequency signal F1 and the second frequency signal F2 are controlled to have substantially the same frequency and a desired phase difference. As a result of x being adjusted, a desired phase difference from 0 to 90 degrees may be obtained. In the phase adjustment circuit illustrated in FIG. 6, since loads on the outputs of the voltage controlled oscillators 10 and 11 become equalized keeping the symmetry of the circuit, the operation is stabilized.

Figure 7:
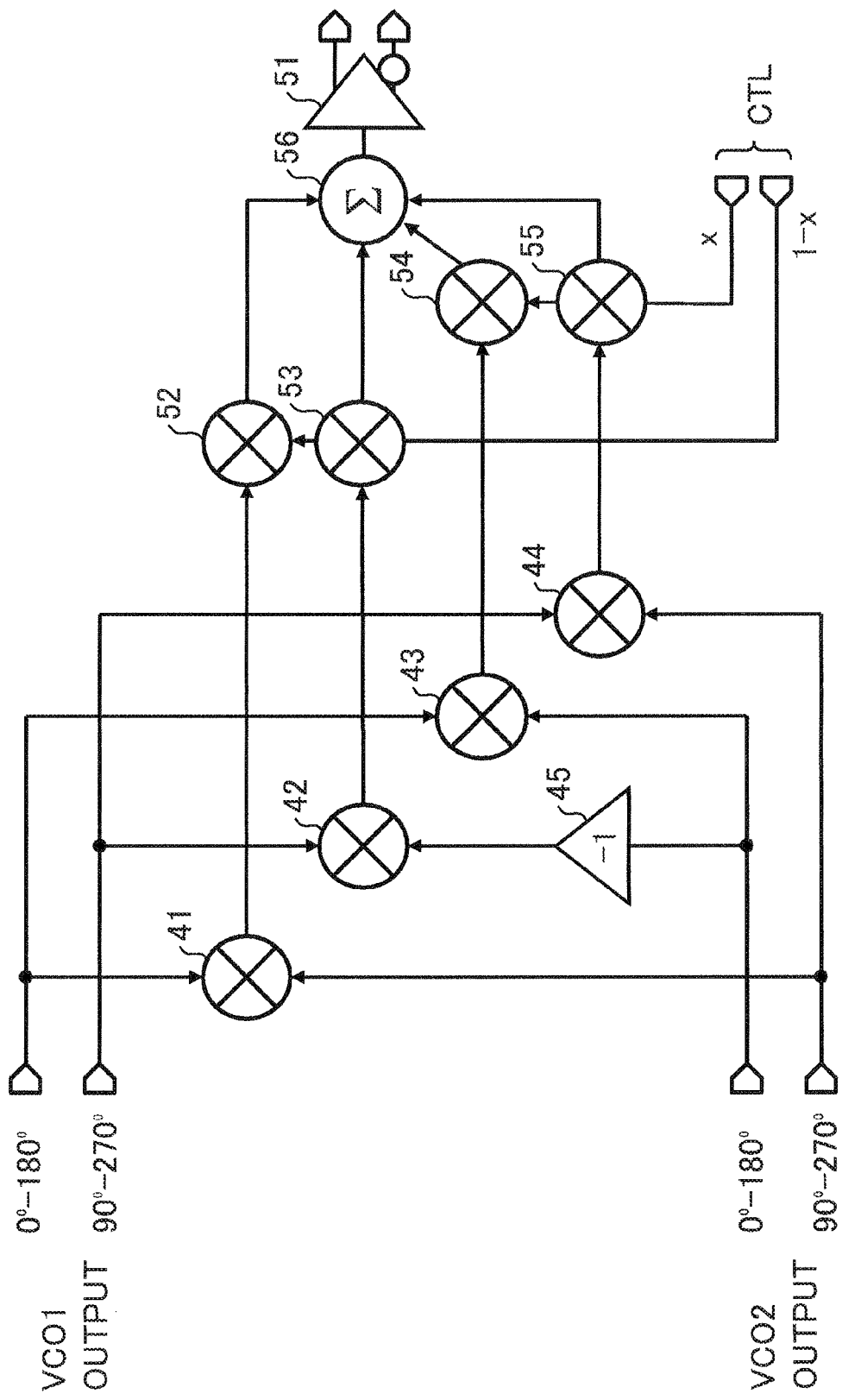
FIG. 7 illustrates an exemplary phase adjustment circuit.

FIG. 7 illustrates an exemplary phase adjustment circuit. The phase adjustment circuit illustrated in FIG. 7 may be the phase adjustment circuit 12 illustrated in FIG. 1. In the phase adjustment circuit illustrated in FIG. 7, like numbers are given to components which have functions substantially the same as or similar to those of the phase adjustment circuit illustrated in FIG. 2. In the phase adjustment circuit 12 illustrated in FIG. 7, the outputs of the mixer circuits 41 and 42 are multiplied with 1−x by the weighting circuits 52 and 53, respectively, and the outputs of the mixer circuits 43 and 44 are multiplied with x by the weighting circuits 54 and 55, respectively. The four signals after weighting are summed by the summing circuit 56 to provide a sum. A total sum may be calculated after the outputs of the mixer circuits are weighted. The output of the phase adjustment circuit illustrated in FIG. 7 may be substantially the same as the output of the phase adjustment circuit illustrated in FIG. 2.

Figure 8:
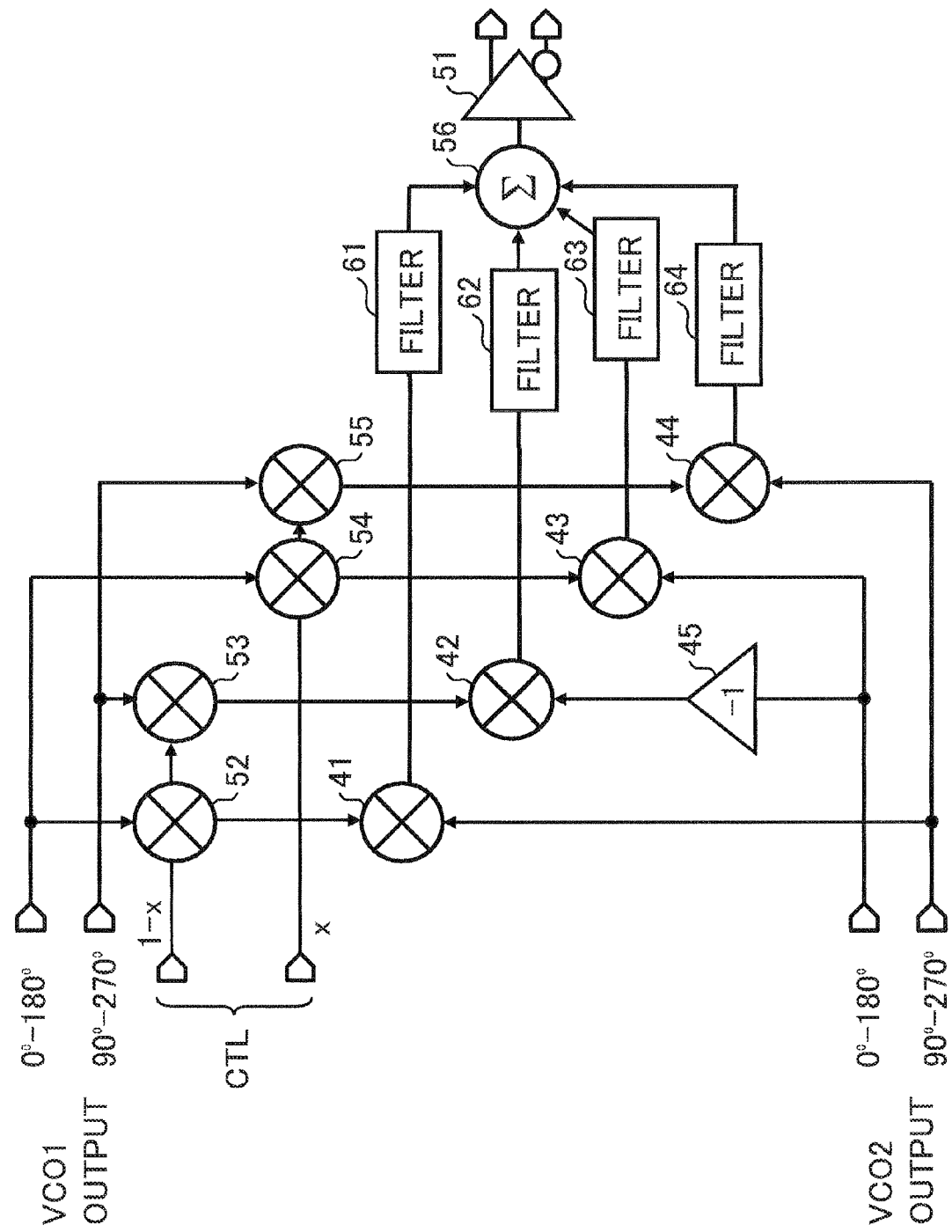
FIG. 8 illustrates an exemplary phase adjustment circuit.

FIG. 8 illustrates an exemplary phase adjustment circuit. The phase adjustment circuit illustrated in FIG. 8 may be the phase adjustment circuit 12 illustrated in FIG. 1. In the phase adjustment circuit illustrated in FIG. 8, like numbers are given to components which have functions substantially the same as or similar to those of the phase adjustment circuit illustrated in FIG. 2. In the phase adjustment circuit 12 illustrated in FIG. 8, weighting circuits 52 to 55 are provided between the outputs of the voltage controlled oscillator (VCO1) 10 and the inputs of the mixer circuits 41 to 44, respectively. Before mixing by the mixer circuits, the outputs of the voltage controlled oscillator 10 may be multiplied by a weight in accordance with the control signal CTL (x and x−1). The respective outputs of the mixer circuits 41 to 44 are low-pass filtered by filters 61 to 64. As a result, noise components are removed from the direct-current voltage component which indicates the phase difference, and the operation may be stabilized.

Figure 9:
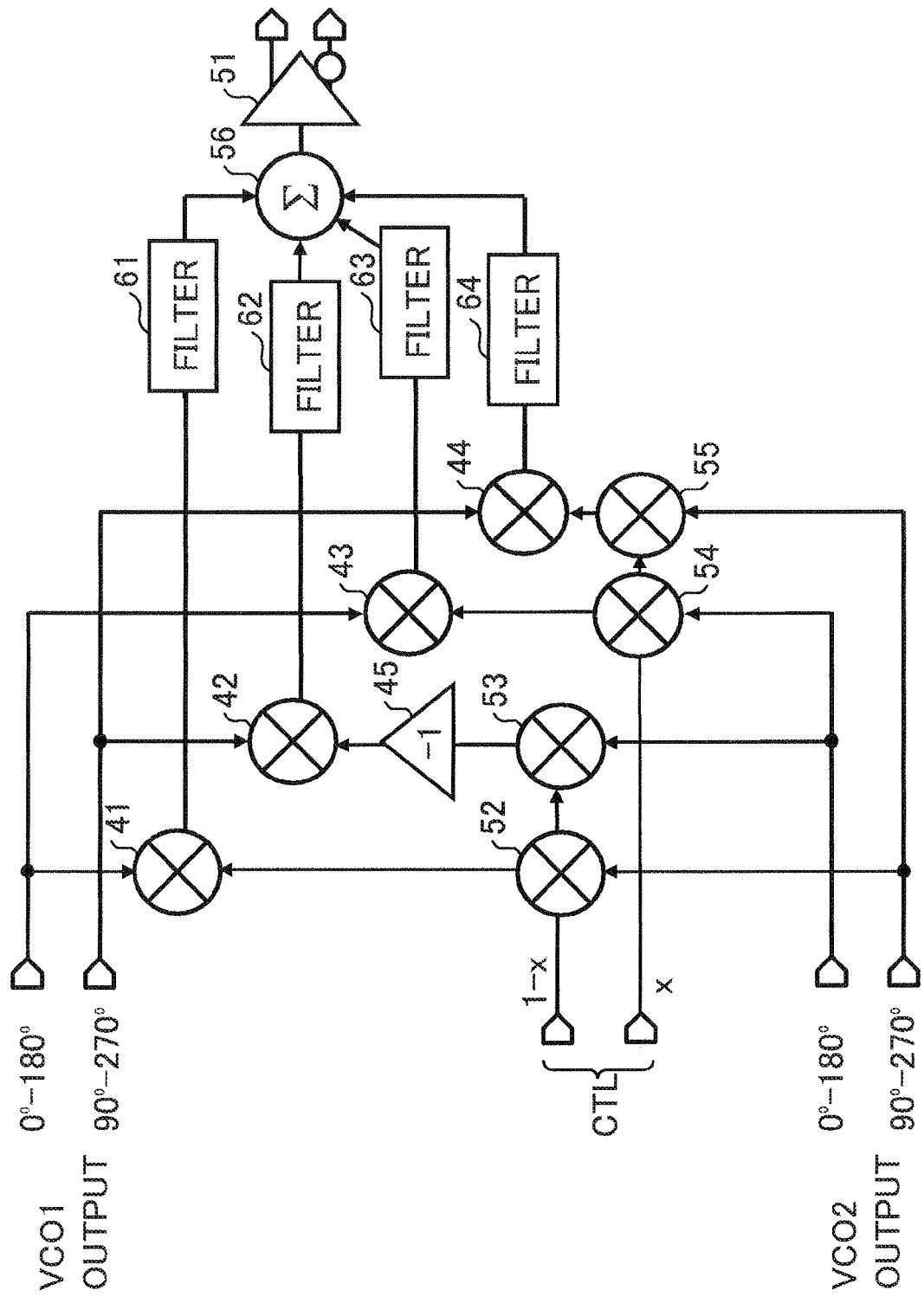
FIG. 9 illustrates an exemplary phase adjustment circuit.

FIG. 9 illustrates an exemplary phase adjustment circuit. The phase adjustment circuit illustrated in FIG. 9 may be the phase adjustment circuit 12 illustrated in FIG. 1. In the phase adjustment circuit illustrated in FIG. 9, like numbers are given to components which have functions substantially the same as or similar to those of the phase adjustment circuit illustrated in FIG. 2. In the phase adjustment circuit 12 illustrated in FIG. 9, weighting circuits 52 to 55 are provided between the outputs of the voltage controlled oscillator (VCO2) 11 and the inputs of the mixer circuits 41 to 44, respectively. Before mixing by the mixer circuits, the outputs of the voltage controlled oscillator 11 may be multiplied by a weight in accordance with the control signal CTL (x and x−1). The respective outputs of the mixer circuits 41 to 44 are low-pass filtered by filters 61 to 64. As a result of that, noise components are removed from the direct-current voltage component, which indicates the phase difference, and the operation may be stabilized.

Figure 10:
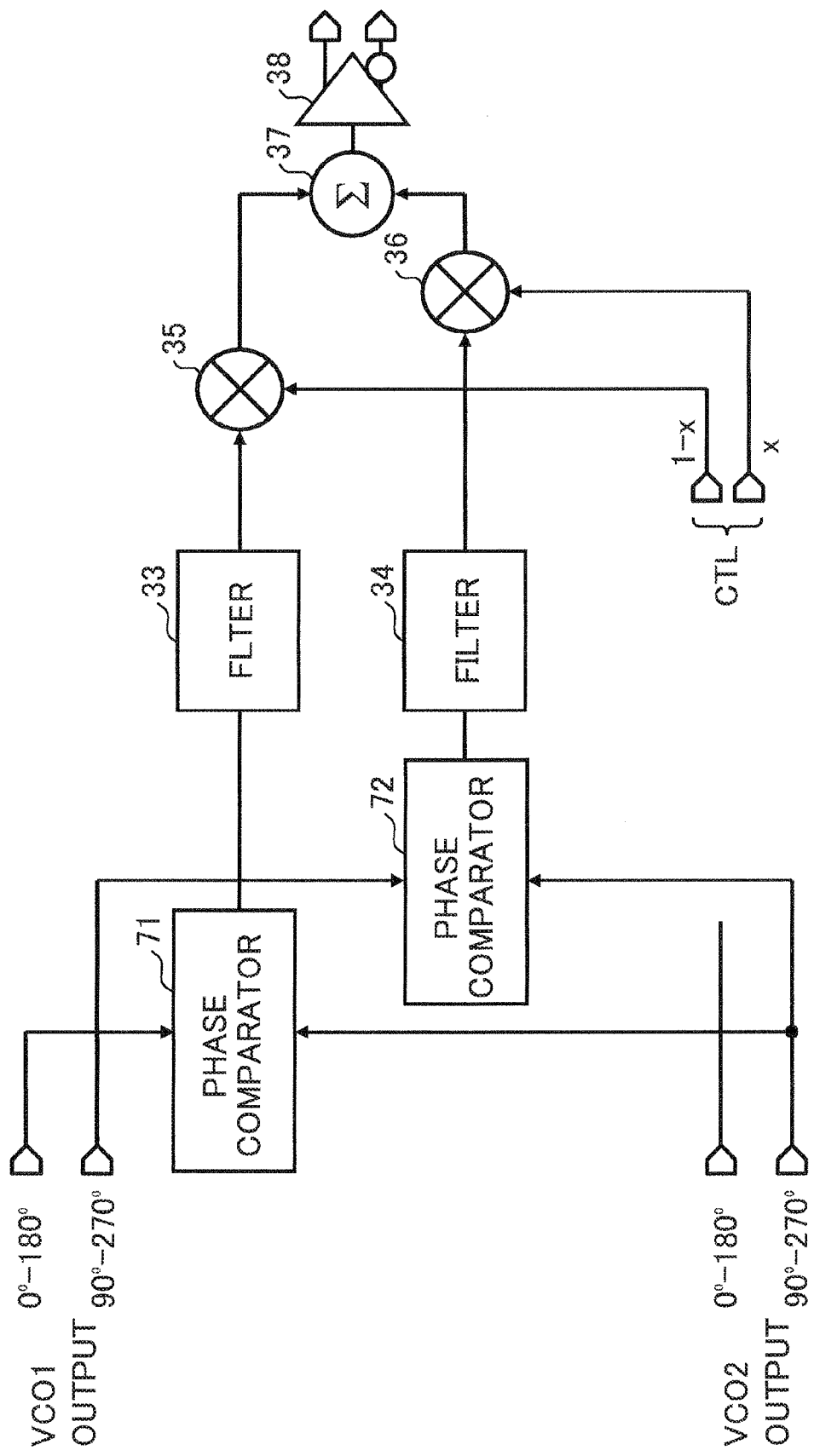
FIG. 10 illustrates an exemplary phase adjustment circuit.

FIG. 10 illustrates an exemplary phase adjustment circuit. The phase adjustment circuit illustrated in FIG. 10 may be the phase adjustment circuit 12 illustrated in FIG. 1. In the phase adjustment circuit illustrated in FIG. 10, like numbers are given to components which have functions substantially the same as or similar to those of the phase adjustment circuit illustrated in FIG. 2. In the phase adjustment circuit 12 illustrated in FIG. 10, phase comparators 71 and 72 are used to generate signal components indicating phase difference.

The phase comparator 71 receives the frequency signals of 0 and 180 degrees within the first frequency signal F1 with four phases, and the frequency signals of 90 and 270 degrees within the second frequency signal F2 with four phases. The frequency signals of 0 and 180 degrees within the first frequency signal F1 with four phases may be in a differential relationship with each other. The frequency signals of 90 and 270 degrees within the second frequency signal F2 with four phases may be in a differential relationship with each other. The phase comparator 71 detects the phase difference between input frequency signals, and outputs a signal in accordance with the phase difference between the input frequency signals. A data sorting part 72 receives the frequency signals of 90 and 270 degrees within the first frequency signal F1 with four phases and the frequency signals of 90 and 270 degrees within the second frequency signal F2 with four phases. The data sorting part 72 detects the phase difference between the input frequency signals and outputs a signal in accordance with the phase difference between the input frequency signals. The other configuration may be substantially the same as or similar to that of the phase adjustment circuit illustrated in FIG. 2.

The phase comparators 71 and 72 may include, for example, an XOR circuit, etc. In the case where an XOR circuit is included, when the frequencies of the input frequency signals are substantially equal to each other, a pulse stream signal which includes pulses having a width in accordance with the phase difference between the input frequency signals may be output. The pulse stream signal is low-pass filtered by the filters 33 and 34 and a direct-current voltage signal having a voltage in accordance with the phase difference is generated.

Figure 11:
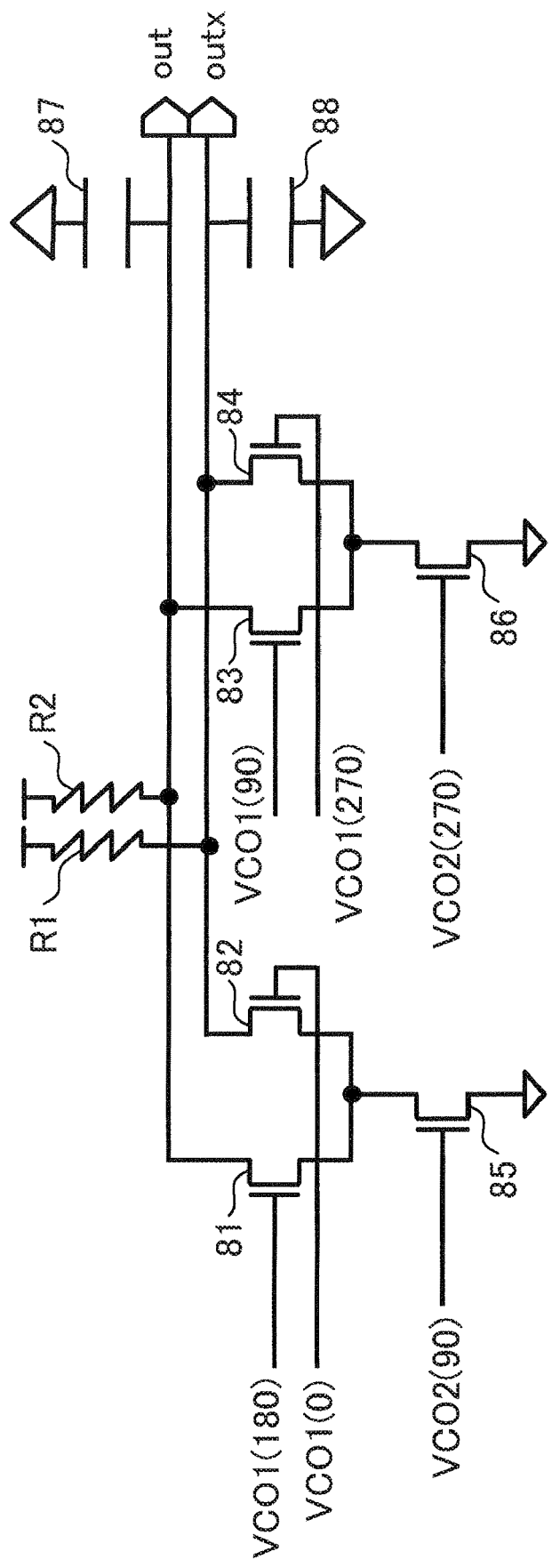
FIG. 11 illustrates an exemplary mixer circuit.

FIG. 11 illustrates an exemplary mixer circuit. The mixer circuit illustrated in FIG. 11 may be included in the previous phase adjustment circuits. The mixer circuit illustrated in FIG. 11 may include, for example, a Gilbert cell type mixer circuit. The mixer circuit includes MOS transistors 81 to 86, capacitance elements 87 and 88, and resistance elements R1 and R2. In the mixer circuit, a current corresponding to the product of a differential signal of the first frequency signal F1 and a differential signal of the second frequency signal F2 is generated, and the electric-current signal is converted into a voltage signal by the resistance elements R1 and R2 so that a pair of differential signals "out" and "outx" are output. The resistance elements R1 and R2 and the capacitance elements 87 and 88 may perform filtering.

Figure 12:
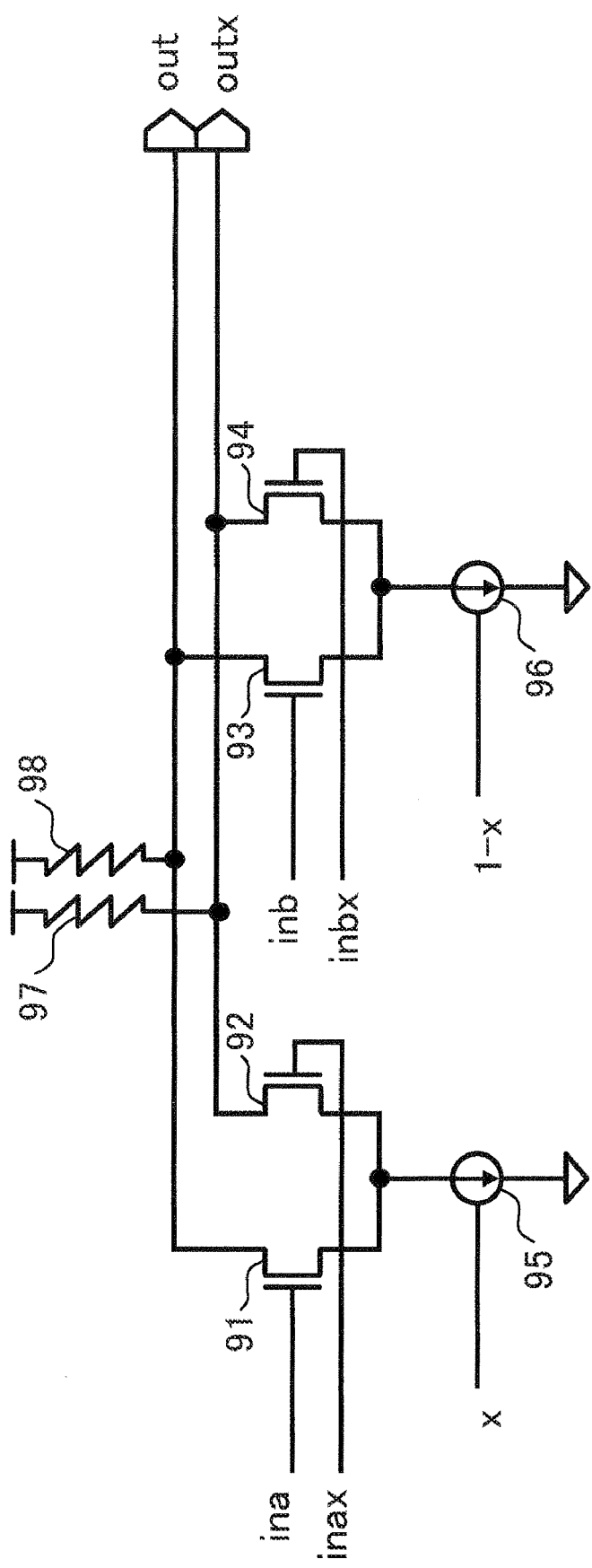
FIG. 12 illustrates an exemplary weighting circuit and an exemplary summing circuit.

FIG. 12 illustrates an exemplary weighting circuit and an exemplary summing circuit. The weighting circuit and the summing circuit illustrated in FIG. 12 may be included in the previous phase adjustment circuits. The weighting circuit and the summing circuit illustrated in FIG. 12 include MOS transistors 91 to 94, current sources 95 and 96, and resistance elements 97 and 98. The MOS transistors 91 and 92 and the current source 95 generate a first current corresponding to a value obtained by multiplying the differential input signals "ina" and "inax" by a weight x. The current source 95 may be an element which supplies a current in accordance with the magnitude of x, and may include, for example, a MOS transistor, the gate of which a voltage value x is applied. The MOS transistors 93 and 94 and the current source 96 generate a second current corresponding to a value obtained by multiplying the differential input signals "inb" and "inbx" by a weight 1−x. The current source 96 may be an element which supplies a current in accordance with the magnitude of 1−x, and may include, for example, a MOS transistor, the gate of which a voltage value 1−x is applied. The first current and the second current are superposed by the resistance elements 97 and 98 so that a voltage signal corresponding to the summed current is generated. The voltage signal is output as a pair of differential signals "out" and "outx".

Figure 13:
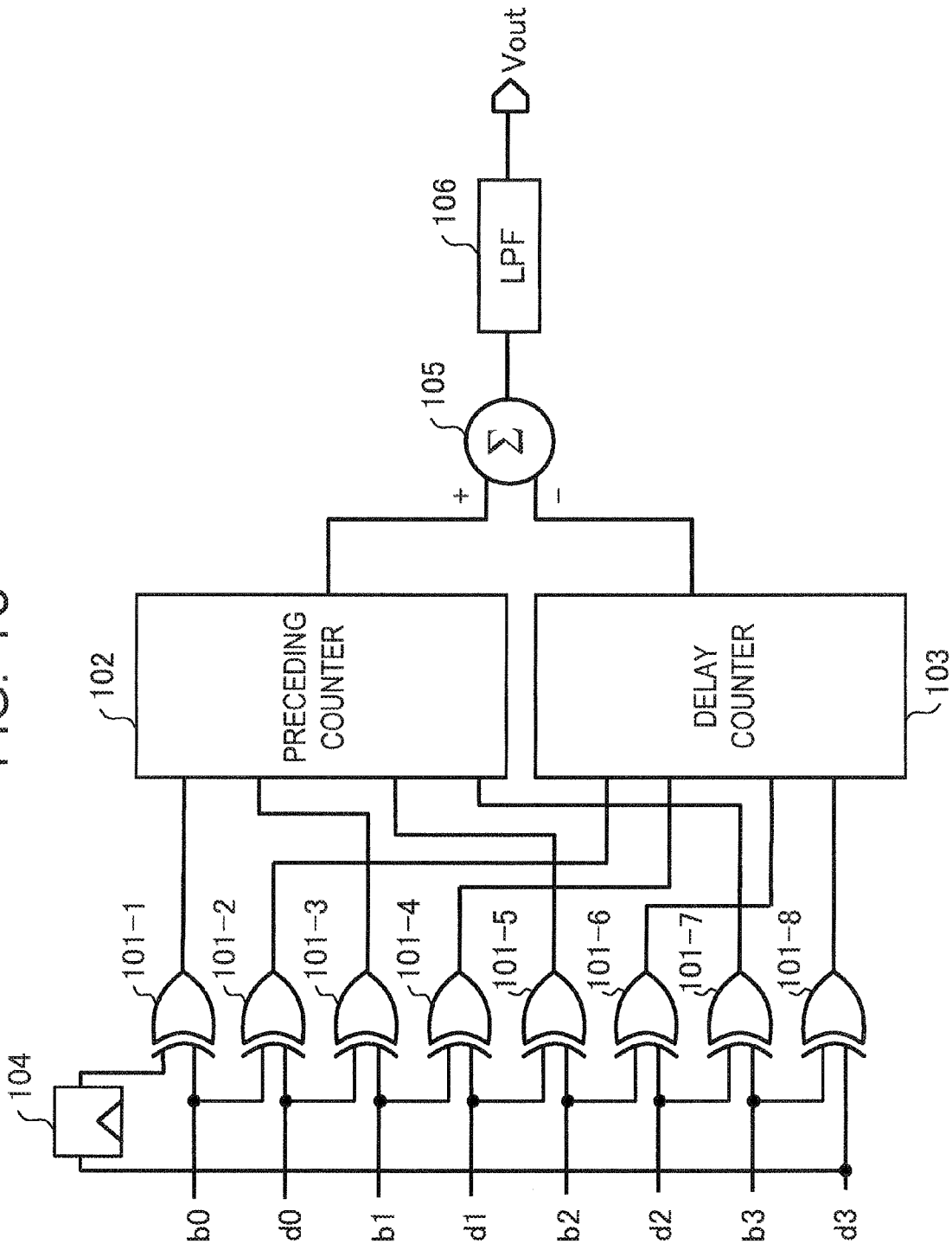
FIG. 13 illustrates an exemplary data phase detector.

FIG. 13 illustrates an exemplary data phase detector. The data phase detector illustrated in FIG. 13 may be the data phase detector 15 illustrated in FIG. 1. The data phase detector 15 illustrated in FIG. 13 includes XOR circuits 101-1 to 101-8, a preceding counter 102, a delay counter 103, a flip-flop 104, a summing circuit 105, and a low-pass filter 106 (LPF). The XOR circuits 101-1 to 101-8 receive, for example, data determination values d0 to d3 detected by the data determination unit 13 illustrated in FIG. 1, and boundary determination values b0 to b3 detected by the boundary determination unit 14 illustrated in FIG. 1. The data determination values and the boundary determination values may be parallelized by the demultiplexers 20 and 21, or may be supplied to the XOR circuits 101-1 to 101-8 as parallel data as illustrated in FIG. 13.

Figure 14:
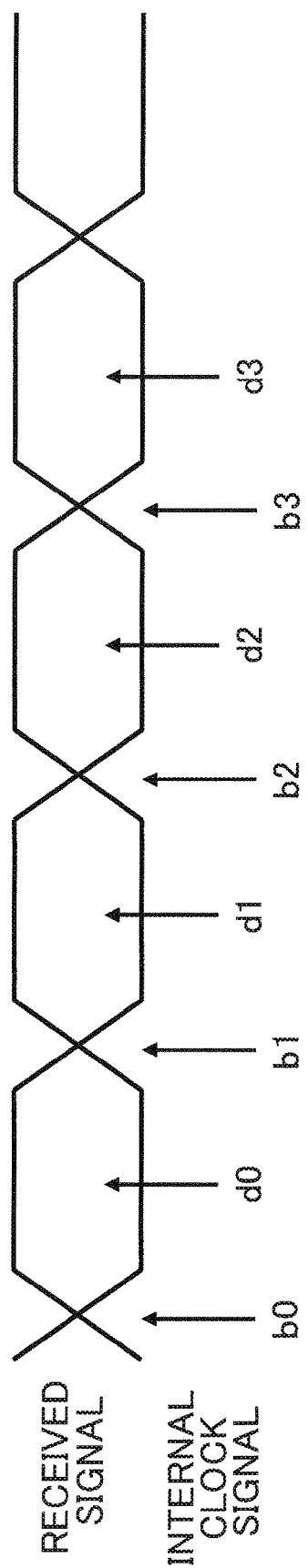
FIG. 14 illustrates an exemplary data determination value and an exemplary boundary determination value.

FIG. 14 illustrates exemplary data determination values and exemplary boundary determination values. For example, since the received signal is sampled in synchronization with the edges of an internal clock (synchronization timing illustrated by arrows in the figure), the data determination values d0 to d3 and the boundary determination values b0 to b3 illustrated in FIG. 14 are obtained. In FIG. 14, the boundary determination values b0 to b3 are detected at data boundaries of the received signal, and data determination values d0 to d3 are detected near the central portions of the data eyes of the received signal. For example, in the clock and data recovery circuit illustrated in FIG. 1, since an internal clock signal, which has the timing relationship illustrated in FIG. 14, for example, a phase relationship, is generated for the received signal, received data may be accurately detected. For example, the data phase detector 15 illustrated in FIG. 13 detects the phase relationship between the internal clock and the received signal and, based on the detection result, the phase of the internal clock signal is adjusted.

The preceding counter 102 illustrated in FIG. 13 performs XOR operation (exclusive OR operation) on a preceding data determination value and a succeeding boundary determination value, for example, the data determination value d1 and the boundary determination value b2 illustrated in FIG. 14, and sums XOR-operated values to count the number of values to be XOR-operated. For example, as the frequency at which a preceding data determination value substantially equals to a succeeding boundary determination value increases, the count value output by the preceding counter 102 decreases. As the frequency at which a preceding data determination value differs from a succeeding boundary determination value increases, the count value output by the preceding counter 102 increases. The delay counter 103 performs XOR operation (exclusive OR operation) on a preceding boundary determination value and a succeeding data determination value, for example, the boundary determination value b1 and the data determination value d1 illustrated in FIG. 14 and sums the XOR-operated values to count the number of the values to be XOR-operated. As the frequency at which a preceding boundary determination value differs from a succeeding data determination value increases, the count value output by the delay counter 103 increases. As the frequency at which a preceding boundary determination value substantially equals to a succeeding data determination value increases, the count value outputted by the delay counter 103 decreases.

The summing circuit 105 subtracts the counter value of the delay counter 103 from the counter value of the preceding counter 102. The low-pass filter 106 performs the low-pass filtering of the subtraction result output by the summing circuit 105, thereby removing undesired noise components. The output voltage Vout from the low-pass filter 106 increases as the frequency at which a preceding data determination value differs from a succeeding boundary determination value increases, and decreases as the frequency at which a preceding data determination value substantially equals to a succeeding boundary determination value increases. Based on the variation of the output voltage Vout, for example, the oscillation frequencies of the voltage controlled oscillators 10 and 11 illustrated in FIG. 1 are controlled, so that the phase of clock with respect to the phase of received signal is adjusted to have an appropriate relationship.

Figure 15:
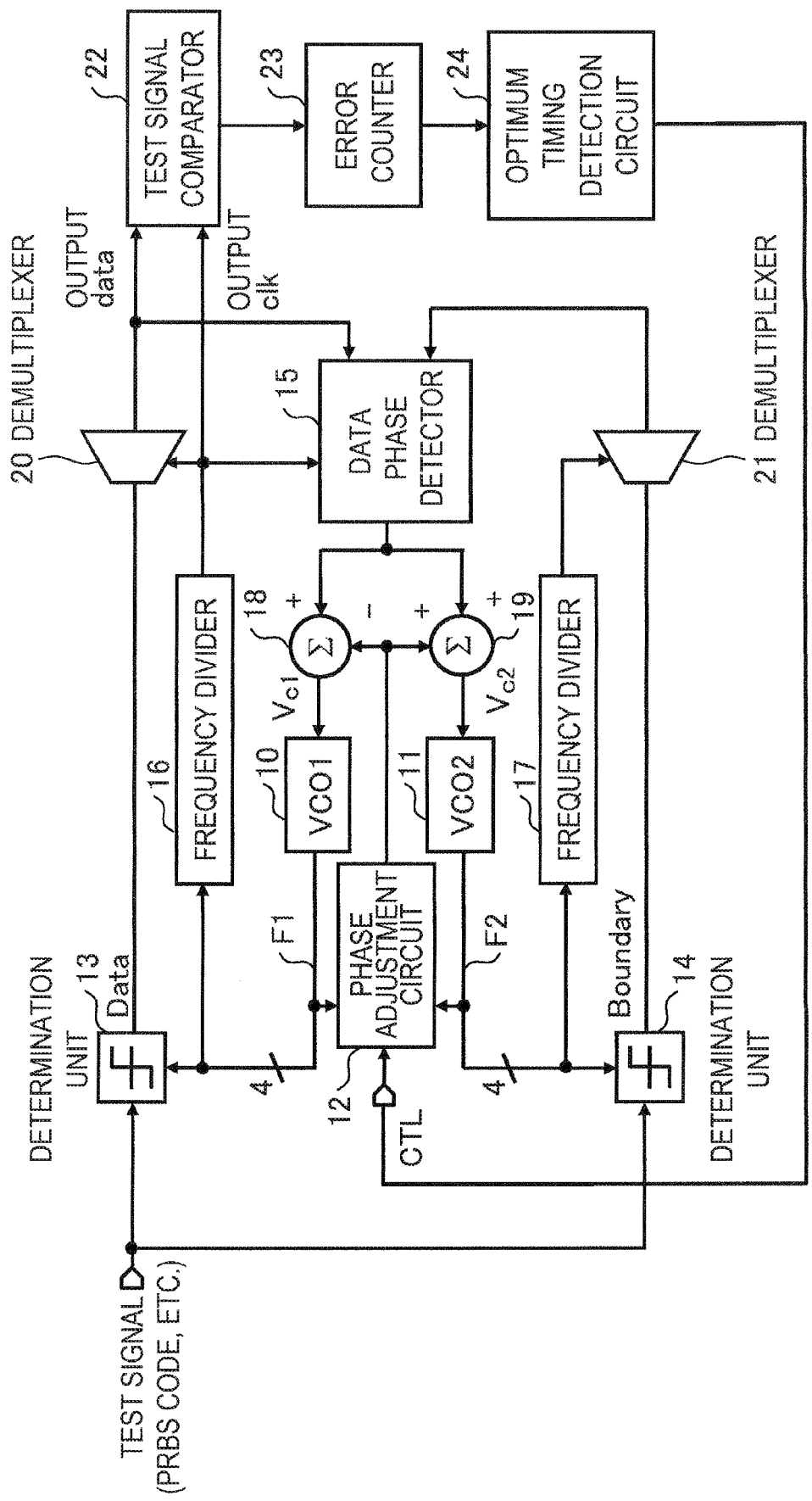
FIG. 15 illustrates an exemplary clock and data recovery circuit.

FIG. 15 illustrates an exemplary clock and data recovery circuit. In FIG. 15, like numbers are given to the same elements as those illustrated in FIG. 1, and description thereof will be omitted or reduced. The clock and data recovery circuit illustrated in FIG. 15 includes a test signal comparator 22, an error counter 23, and an optimum timing detection circuit 24. The configuration of the remaining components of the clock and data recovery circuit illustrated in FIG. 15 may be substantially the same as or similar to the configuration of the data recovery circuit illustrated in FIG. 1. For example, a test signal such as pseudorandom bit sequence (PRBS) may be input to the clock and data recovery circuit. The test signal comparator 22, which may include, for example, a pseudo-random bit-sequence detection circuit, determines whether or not the bit sequence detected by the data determination unit 13 coincides with an expected value sequence. When the detected bit sequence differs from the expected value, the test signal comparator 22 outputs "1", and when the detected bit sequence equals to the expected value, the test signal comparator 22 outputs "0". The error counter 23 monitors the output of the test signal comparator 22 and counts the number of the outputs. A larger counter value indicates that the number of errors is large. The optimum timing detection circuit 24 adjusts the control signal CTL, for example, x and 1−x of the control signal CTL in accordance with the count value. For example, the control signal CTL is varied in such a way that the count value decreases, and the control signal CTL is set when the count value becomes minimum. In FIG. 15, the control signal CTL is generated based on the received signal.

Figure 16:
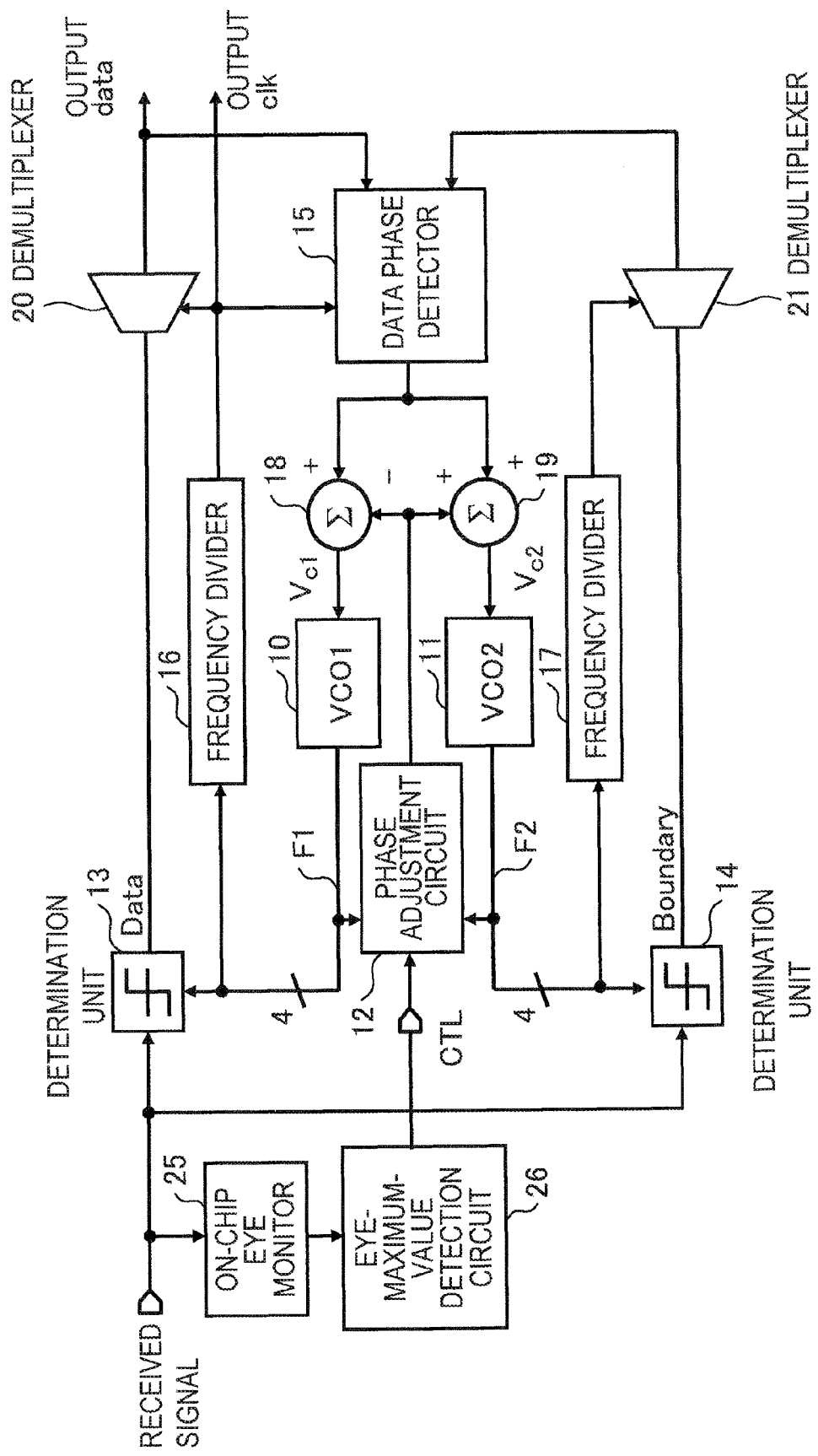
FIG. 16 illustrates an exemplary clock and data recovery circuit.

FIG. 16 illustrates an exemplary clock and data recovery circuit. In FIG. 16, like symbols are given to the same elements as those illustrated in FIG. 1, and detailed description thereof will be omitted or reduced. The clock and data recovery circuit illustrated in FIG. 16 includes an on-chip eye monitor 25 and an eye-maximum-value detection circuit 26. The configuration of the remaining components may be substantially the same as or similar to the configuration illustrated in FIG. 1. The on-chip eye monitor 25 monitors the received signal and outputs data relating to the waveform of the received signal. The eye-maximum-value detection circuit 26 detects data waveform of a received signal, for example, the position of the maximum amplitude value of an eye, based on the data from the on-chip eye monitor 25. The eye-maximum-value detection circuit 26 adjusts the control signal CTL, for example, x and 1−x of the control signal CTL based on the position of the maximum amplitude value. For example, when the position of the maximum amplitude value is substantially located in the center of the data eye, the value of x is set such that the phase difference between the data determination clock and the boundary determination clock is 90 degrees.

Figure 17:
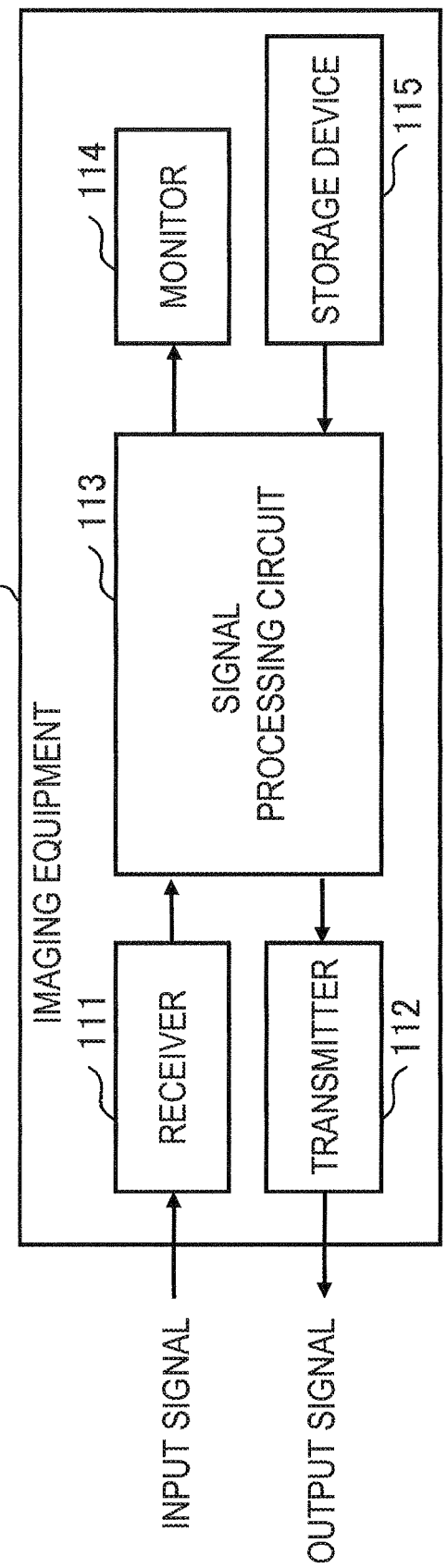
FIG. 17 illustrates an exemplary system.

FIG. 17 illustrates an exemplary system. The system illustrated in FIG. 17 may include the previous clock and data recovery circuits. The system illustrated in FIG. 17 may include imaging equipment 110. The imaging equipment 110 includes, for example, a receiver 111, a transmitter 112, a signal processing circuit 113, a monitor 114, and a storage device 115. For example, the receiver 111 may include the previous clock and data recovery circuits. The receiver 111 uses the clock and data recovery circuit to recover a clock signal of appropriate timing, and detects and determines an input signal based on the recovered clock signal. The received signal that has been detected and determined by the receiver 111 is subjected to a given signal processing by the signal processing circuit 113. The result of the signal processing is displayed on the monitor 114 or stored in the storage device 115. The signal output by the signal processing circuit 113 may be output to the outside via the transmitter 112.

Example embodiments of the present invention have now been described in accordance with the above advantages. It will be appreciated that these examples are merely illustrative of the invention. Many variations and modifications will be apparent to those skilled in the art.

The invention claimed is:

1. A clock generation circuit, comprising:
a first determination circuit configured to receive an input signal and detect the input signal at a first phase position based on a first frequency signal;
a second determination circuit configured to receive the input signal and detect the input signal at a second phase position based on a second frequency signal;
a phase detector configured to compare an output of the first determination circuit and an output of the second determination circuit, and to output a comparison result;
a first summing circuit configured to sum the comparison result and a first control signal;
a second summing circuit configured to sum the comparison result and a second control signal;
a first voltage controlled oscillation circuit configured to receive the output of the first summing circuit, and to output the first frequency signal;
a second voltage controlled oscillation circuit configured to receive the output of the second summing circuit, and to outputs the second frequency signal; and
a phase adjustment circuit configured to generate the first control signal and the second control signal based on the first frequency signal and the second frequency signal.

2. The clock generation circuit according to claim 1, wherein
the first frequency signal includes a third frequency signal and a fourth frequency signal, and
the second frequency signal includes a fifth frequency signal and a sixth frequency signal.

3. The clock generation circuit according to claim 2, wherein
the phase adjustment circuit includes:
a first mixer configured to receive the third frequency signal and the sixth frequency signal and to output a seventh frequency signal;
a second mixer configured to receive the fourth frequency signal and the sixth frequency signal and to output an eighth frequency signal;
a filter configured to filter the seventh frequency signal and the eighth frequency signal;
a first weighting circuit configured to weigh a filtered seventh frequency signal based on a first phase control signal;
a second weighting circuit configured to weigh a filtered eighth frequency signal based on a second phase control signal;
a third summing circuit configured to sum an output of the first weighting circuit and an output of the second weighting circuit; and
an output circuit configured to output the first control signal and the second control signal based on the output of the third summing circuit.

4. The clock generation circuit according to claim 2, wherein
the phase adjustment circuit includes:
a first weighting circuit configured to weigh the third frequency signal based on a first phase control signal;
a first mixer configured to receive an output of the first weighting circuit and the sixth frequency signal, and to output a seventh frequency signal;
a second weighting circuit configured to weigh the fourth frequency signal based on a second phase control signal;
a second mixer configured to receive an output of the second weighting circuit and the sixth frequency signal, and to output an eighth frequency signal;
a filter configured to filter the seventh frequency signal and the eighth frequency signal;
a third summing circuit configured to sum a filtered seventh frequency signal and a filtered eighth frequency signal; and
an output circuit configured to output the first control signal and the second control signal based on an output of the third summing circuit.

5. The clock generation circuit according to claim 2, wherein
the phase adjustment circuit includes:
a first weighting circuit configured to weight the sixth frequency signal based on a first phase control signal;
a first mixer configured to receive an output of the first weighting circuit and the third frequency signal and to output a seventh frequency signal;
a second weighting circuit configured to weigh the sixth frequency signal based on a second phase control signal;
a second mixer configured to receive an output of the second weighting circuit and the fourth phase control signal and to output an eighth frequency signal;
a filter configured to filter the seventh frequency signal and the eighth frequency signal;
a third summing circuit configured to sum signals a filtered seventh frequency signal and a filtered eighth frequency signal; and
an output circuit configured to output the first control signal and the second control signal based on an output of the third summing circuit.

6. The clock generation circuit according to claim 2, wherein
the phase adjustment circuit includes:
a first mixer configured to receive the third frequency signal and the sixth frequency signal and to output a seventh frequency signal;
a second mixer configured to receive the fourth frequency signal and the fifth frequency signal and to output an eighth frequency signal;
a third mixer configured to receive the third frequency signal and the fifth frequency signal, and to output a ninth frequency signal;
a fourth mixer configured to receive the fourth frequency signal and the sixth frequency signal and to output a tenth frequency signal;
a third summing circuit configured to sum the seventh frequency signal and the eighth frequency signal;
a fourth summing circuit configured to sum the ninth frequency signal and the tenth frequency signal;
a first weighting circuit configured to weigh an output of the third summing circuit based on a first phase control signal;

a second weighting circuit configured to weigh an output of the fourth summing circuit based on a second phase control signal;
a fifth summing circuit configured to sum an output of the first weighting circuit and an output of the second weighting circuit; and
an output circuit configured to output the first control signal and the second control signal based on an output of the fifth summing circuit.

7. The clock generation circuit according to claim 2, wherein
the phase adjustment circuit includes:
a first mixer configured to receive the third frequency signal and the sixth frequency signal and to output a seventh frequency signal;
a second mixer configured to receive the fourth frequency signal and the fifth frequency signal and to output an eighth frequency signal;
a third mixer configured to receive the third frequency signal and the fifth frequency signal and to output a ninth frequency signal;
a fourth mixer configured to receive the fourth frequency signal and the sixth frequency signal and to output a tenth frequency signal;
a first weighting circuit configured to weigh the seventh frequency signal based on a first phase control signal;
a second weighting circuit configured to weigh the eighth frequency signal based on the first phase control signal;
a third weighting circuit configured to weigh the ninth frequency signal based on a second phase control signal;
a fourth weighting circuit configured to weigh the tenth frequency signal based on the second phase control signal;
a third summing circuit configured to sum a weighted seventh frequency signal, a weighted eight frequency signal, a weighted ninth frequency signal, and a weighted tenth frequency signal; and
an output circuit configured to output the first control signal and the second control signal based on an output of the third summing circuit.

8. The clock generation circuit according to claim 2, wherein
the phase adjustment circuit includes:
a first weighting circuit configured to weigh the third frequency signal based on a first phase control signal;
a second weighting circuit configured to weigh the fourth frequency signal based on the first phase control signal;
a third weighting circuit configured to weigh the third frequency signal based on a second phase control signal;
a fourth weighting circuit configured to weigh the fourth frequency signal based on the second phase control signal;
a first mixer configured to receive an output of the first weighting circuit and the sixth frequency signal and outputs a seventh frequency signal;
a second mixer configured to receive an output of the second weighting circuit and the fifth frequency signal and to output an eighth frequency signal;
a third mixer configured to receive an output of the third weighting circuit and the fifth frequency signal and outputs a ninth frequency signal;
a fourth mixer configured to receive an output of the fourth weighting circuit and the sixth frequency signal and to output a tenth frequency signal;
a filter configured to filter the seventh frequency signal, the eighth frequency signal, the ninth frequency signal, and the tenth frequency signal;
a third summing circuit configured to sum a filtered seventh frequency signal, a filtered eighth frequency signal, a filtered ninth frequency signal, and a filtered tenth frequency signal; and
an output circuit configured to output the first control signal and the second control signal based on an output of the third summing circuit.

9. The clock generation circuit according to claim 2, wherein
the phase adjustment circuit includes:
a first phase comparator configured to receive the third frequency signal and the sixth frequency signal and to output a seventh frequency signal;
a second phase comparator configured to receive the fourth frequency signal and the sixth frequency signal and to output an eighth frequency signal;
a filter configured to filter the seventh frequency signal and the eighth frequency signal;
a first weighting circuit configured to weigh a filtered seventh frequency signal based on a first phase control signal;
a second weighting circuit configured to weigh a filtered eighth frequency signal based on a second phase control signal;
a third summing circuit configured to sum an output of the first weighting circuit and an output of the second weighting circuit; and
an output circuit configured to output the first control signal and the second control signal based on an output of the third summing circuit.

10. The clock generation circuit according to claim 3, wherein
a value of the first phase control signal is 1−X when a value of the second phase control signal is X (0<X<1).

11. The clock generation circuit according to claim 1, wherein
the first control signal and the second control signal are complementary signals.

12. A system comprising:
a receiving circuit configured to receive an input signal from outside; and
a signal processing circuit configured to process the input signal,
wherein the receiving circuit includes a clock generation circuit configured to generate a clock for receiving the input signal and the clock generation circuit includes:
a first determination circuit configured to receive an input signal and to detect the input signal at a first phase position based on a first frequency signal;
a second determination circuit configured to receive the input signal and to detect the input signal at a second phase position based on a second frequency signal;
a phase detector configured to compare an output of the first determination circuit and an output of the second determination circuit and to output a comparison result;
a first summing circuit configured to sum the comparison result and a first control signal;
a second summing circuit configured to sum the comparison result and a second control signal;
a first voltage controlled oscillation circuit configured to receive the output of the first summing circuit and to output the first frequency signal;
a second voltage controlled oscillation circuit configured to receive the output of the second summing circuit and to output the second frequency signal; and a phase adjustment circuit configured to generate the first control signal and the second control signal based on the first frequency signal and the second frequency signal.

13. A clock generation circuit comprising:

a first voltage controlled oscillation circuit configured to output a first frequency signal in accordance with a first input voltage;

a second voltage controlled oscillation circuit configured to output a second frequency signal in accordance with a second input voltage;

a phase adjustment circuit configured to receive a control signal and to control the first input voltage and the second input voltage such that a phase difference between the first frequency signal and the second frequency signal becomes a value in accordance with the control signal;

a first determination circuit configured to detect a received signal in synchronization with the first frequency signal;

a second determination circuit configured to detect the received signal in synchronization with the second frequency signal; and a phase detector configured to detect a phase of the received signal based on an output of the first determination circuit and an output of the second determination circuit, and to control the first input voltage and the second input voltage in accordance with a result of the phase detection.

14. The clock generation circuit according to claim 13, further comprising:

a circuit configured to generate the control signal based on the received signal.

15. The clock generation circuit according to claim 13, further comprising:

a circuit configured to generate the control signal based on the output of the first determination circuit.

* * * * *